United States Patent [19]
Huang

[11] Patent Number: 6,091,253
[45] Date of Patent: Jul. 18, 2000

[54] JIG FOR ELECTRICALLY BRIDGING BETWEEN A CIRCUIT BOARD AND A TESTER DURING TESTING OF THE CIRCUIT BOARD

[75] Inventor: Kent Huang, Tainan Hsien, Taiwan

[73] Assignee: Acer Peripherals, Inc., Taoyuan, Taiwan

[21] Appl. No.: 08/835,718

[22] Filed: Apr. 10, 1997

[30] Foreign Application Priority Data

Jan. 24, 1997 [TW] Taiwan ................................. 86201311

[51] Int. Cl.[7] .......................... G01R 1/073; G01R 31/02; G01R 31/28; G01R 1/06
[52] U.S. Cl. ........................................... 324/758; 324/761
[58] Field of Search .................................. 324/754, 755, 324/757, 758, 761, 158.1

[56] References Cited

U.S. PATENT DOCUMENTS 4,771,234  9/1988  Cook et al. .............................. 324/758

*Primary Examiner*—Walter E. Snow
*Attorney, Agent, or Firm*—Pillsbury Madison & Sutro LLP

[57] ABSTRACT

A jig for testing the printed circuit boards utilizes the adjustable guide members to easily position different sizes of circuit boards on a working plate, wherein the working plate can smoothly slide up and down along the guide columns and the elastic members without jamming. The second surface of the working plate is formed with a concavity and several bulged sections to stably place the circuit board without deformation, and therefore the soldering points of the circuit board can uniformly touch the tips of the probes which are retractably installed in the through holes of the base. By using the assembling base, the maintenance of the internal structure of the base can be improved.

20 Claims, 4 Drawing Sheets

JIG FOR ELECTRICALLY BRIDGING BETWEEN A CIRCUIT BOARD AND A TESTER DURING TESTING OF THE CIRCUIT BOARD

BACKGROUND OF THE INVENTION

1. Field of the Invention

The present invention generally relates to a jig for testing a circuit board. More particularly, the present invention relates to a jig which is provided with a working plate for positioning a circuit board thereon easily and smoothly, and the life of probes can be estimated by a counter detecting the times of the movement of the working plate during the testing process.

2. Description of the Related Art

Traditionally, a jig 100 for testing a printed circuit board 10, as shown in FIG. 1, comprises a base body 110, a plurality of through holes 123 and probes 123P, pins 150 and guide bars 160, and a connector 140.

The base body 110 is composed of a top plate 111, a bottom plate 112 and side plates 113, wherein the side plates 113 are arranged between the top plate 111 and the bottom plate 112. In general, the bottom plate 112 is detachably mounted on the lower surface of the side plates 113 by screwing the bolts (not shown in FIG.) thereon so as to proceed the maintenance in the jig 100. On the top plate 111, through holes 123 are formed thereon and fitted with the probes 123P therein. The sites of the probes 123P correspond to the places in the vicinity of the soldering points of the circuit board 10, and therefore the tip of the probes 123P are touched upon the metal portion of the circuit board 10 so as to proceed the testing process, and a connector 140 is mounted on the side plate 113 and electrically coupled to each probe 123P. All the probes 123P are retractably installed in the base body 110 and simultaneously contact the metal portions of the circuit board 10 having the same height. For positioning the circuit board 10 properly, four pins 150 are individually installed on the upper surface 111U of the top plate 111 with respect to the holes 11 of the circuit board 10, and the bars 160 are used to guide the edges of the circuit board 10 onto the top plate 111 when the holes 11 of the circuit board 10 slide along the pins 150.

However, the circuit board 10 is easily locked between the pins 150 if the force applied to the circuit board 10 during placement on or removal from the top plate is not uniform, and therefore often halting the testing process. However, the installation of the bottom plate 112 requires that the bolts be screwed on the lower portion of the side plates 113, thus making maintenance of the interior of the jig 100 is inconvenient and inefficient. On the other hand, the wear of the probes 123P cannot be detected and renovated in time by the conventional jig 100 when the probes 123P have been used for a time. Thus, the life of the probes 123P cannot be effectively estimated by the jig 100.

SUMMARY OF THE INVENTION

Accordingly, it is an object of present invention to provide a working plate for supporting the circuit board properly and bringing the circuit board into contact with the probes simultaneously while performing the testing process.

It is a further purpose of present invention to provide the adjustable guide members for fitting and positioning different sizes of circuit boards.

Yet another purpose of this invention is to form a concavity and bulged sections on a second surface of the working plate for placing the circuit board with no deflection.

Another purpose of the present invention is to use the guide columns and the guide pins which serve as the guiding members as well as the electric members which serve as the cushions for moving the working plate with no jamming.

Another purpose of the present invention is to provide an assembling base for facilitating the maintenance of the internal structure of the jig.

Another purpose of the present invention is to provide a counter for estimating the life of the probes by counting the times of the working plate during the testing process.

To attain the above objects and solve the disadvantages of the conventional art, the present invention provides a jig for electrically bridging between a circuit board and a tester under test, and the circuit board has a plurality of soldering points and holes. The jig of the present invention comprises a base, substantially being a frame structure with a chamber therein, having a first surface which is formed with a plurality of first through holes corresponding to soldering points and at least one guide pin applying to guiding the holes of the circuit board; at least two guide columns for installing on the first surface, and one end of each guide column has a stopper; a working plate having a second surface and a third surface opposite to the second surface, wherein the working plate is installed on the first surface and formed with a plurality of second through holes corresponding to the first through holes in the first surface, and the working plate has at least one first guide hole and at least two second guide holes for containing guide pin and guide columns, respectively, whereas the working plate slides along the guide pin and the guide columns smoothly, and the stroke of the working plate is limited by the stopper of the guide columns; a plurality of elastic members, installed between the working plate and the base, for uniformly moving the working plate; a plurality of probes, retractably installed in the first through holes respectively and outwardly protruded from the first surface, for penetrating the second through holes when the working plate is forced to get close to the first surface and electrically coupling to the soldering points of the circuit board under test, and the probes are electrically coupled to the tester; and a counter installed between the first surface of the base and the working plate for counting the moving times of the working plate and estimating the life of the probes.

The jig of the present invention further comprises at least one guiding member adjustably mounted on the second surface of the working plate, and the guiding member is used to guide the circuit board so as to position in the guide pins as well as place properly the circuit board on the second surface of the working plate. Besides, a counter can be mounted on the working plate to estimate the life of the probes.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Figure 1:
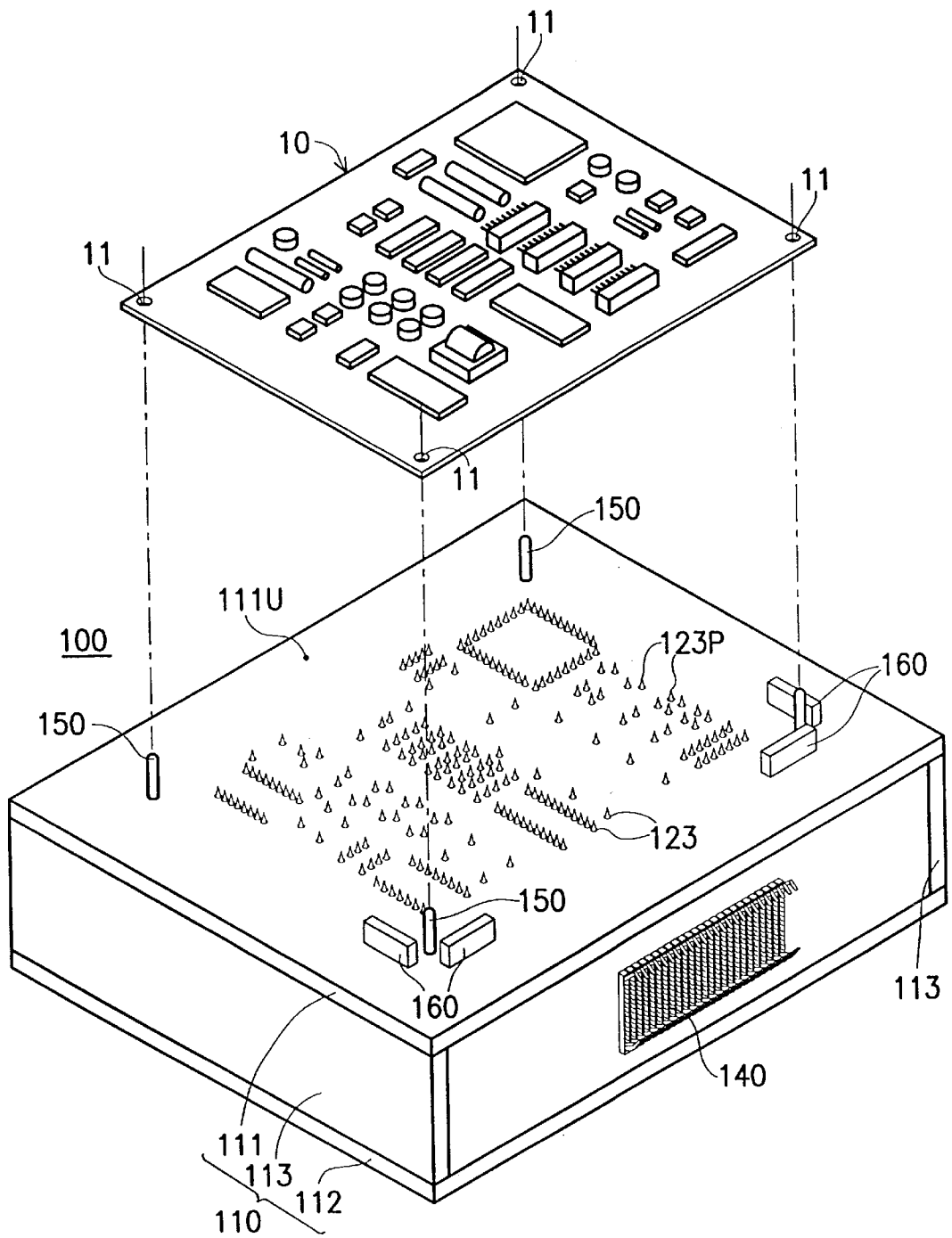
FIG. 1 is a perspective view showing the conventional jig for testing a printed circuit.
Figure 2:
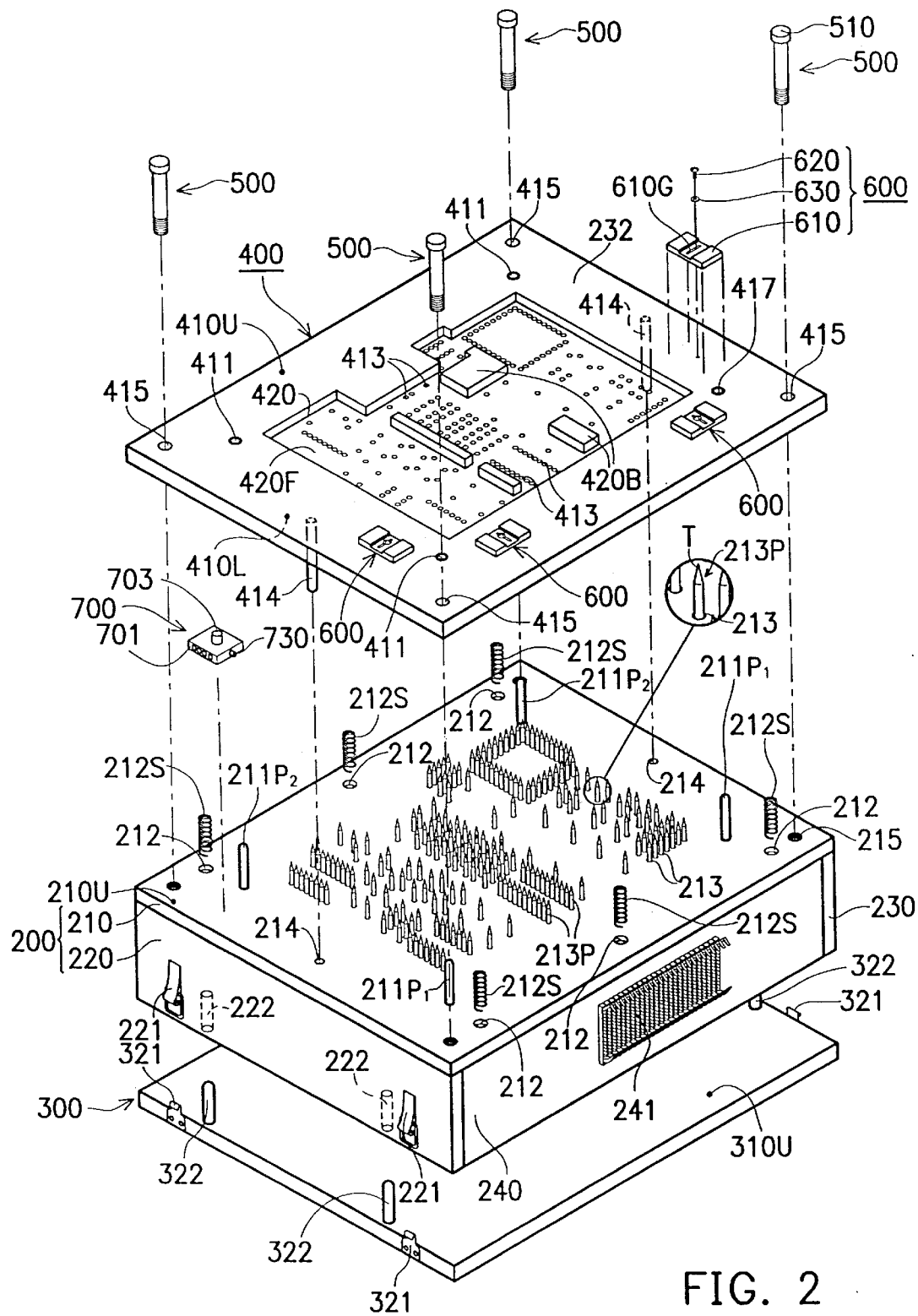
FIG. 2 is a exploded view showing a jig according the present invention.

Referring to FIG. 2, which is a perspective view showing a jig for testing the circuit board 10 according to the present invention. The jig mainly comprises a base(elements 200 and 300) and a working plate 400. The base substantially is a frame structure with a chamber, wherein a top plate 210 is integrally constructed with the side plates 220(230), and a bottom plate 300 is detachably mounted on the lower portion of the side plates 220(230) by the connection of a first joint member(such as rings 221) and a second joint member(such as hooks 321), and posts 322 installed on the fourth surface 310U of the bottom plate 300 can fit to the holes 222 formed in the sides plates 220 so as to facilitate the coupling of rings 221 and hooks 321. The rings 221 and hooks 321 are separately formed on the sidewalls of the side plate 220 and the bottom plate 300. The top plate 210 is formed with a plurality of first through holes 213 corresponding to the places in the vicinity of the soldering points of the circuit board 10, and the first recess 215 are formed on the first surface 210U of the top plate 210 as well as the guide pins $211P_1$, $211P_2$ are formed on the first surface 210U of the top plate 210.

The working plate 400 is mounted onto the first surface 210U of the top plate 210 to serve as an interlayer for placing the circuit board and protecting the circuit board 10 from damage, wherein the working plate 400 has a second surface 410U and a third surface 410L, and a plurality of second through holes 413 are passed through from the second surface 410U to the third surface 410L and individually correspond to each of the first through holes 213 of the top plate 210. Besides, the working plate 400 is provided with the first guide holes 411 and second guide holes 415, wherein the first guide holes 411 are used to position the guide pins $211P_1$, $211P_2$ located on the top plate 210. Further, the dowel holes 214 are formed on the top plate 210, and therefore the working plate 400 may be positioned on the top plate 210 of the base by fitting the dowel pins 414 therein, wherein the dowel pins 414 are formed on the third surface 410L of the working plate 400.

For allowing the working plate 400 to move smoothly, guide columns 500 are installed on the top plate 210 of the base, wherein one end of each guide column 500 is formed with a stopper 510, and another end of the guide column 500 is separately used to detachably engage to the first recess 215 of the top plate 210 of the base. Therefore, by placing the working plate 400 onto the first surface 210U of the top plate 210 along the guide pins $211P_1$, $211P_2$, and then using the guide columns 500 through the second guide holes 415 of the working plate 400 and coupling on the first recess 215, the working plate 400 can slide smoothly along the guide pins $211P_1$, $211P_2$ and the guide columns 500 without jamming, wherein the stroke of the working plate 400 is limited by the stoppers 510 of the guide columns 500. A bolt may be used instead of the guide column 500.

Figures 3A, 3B:
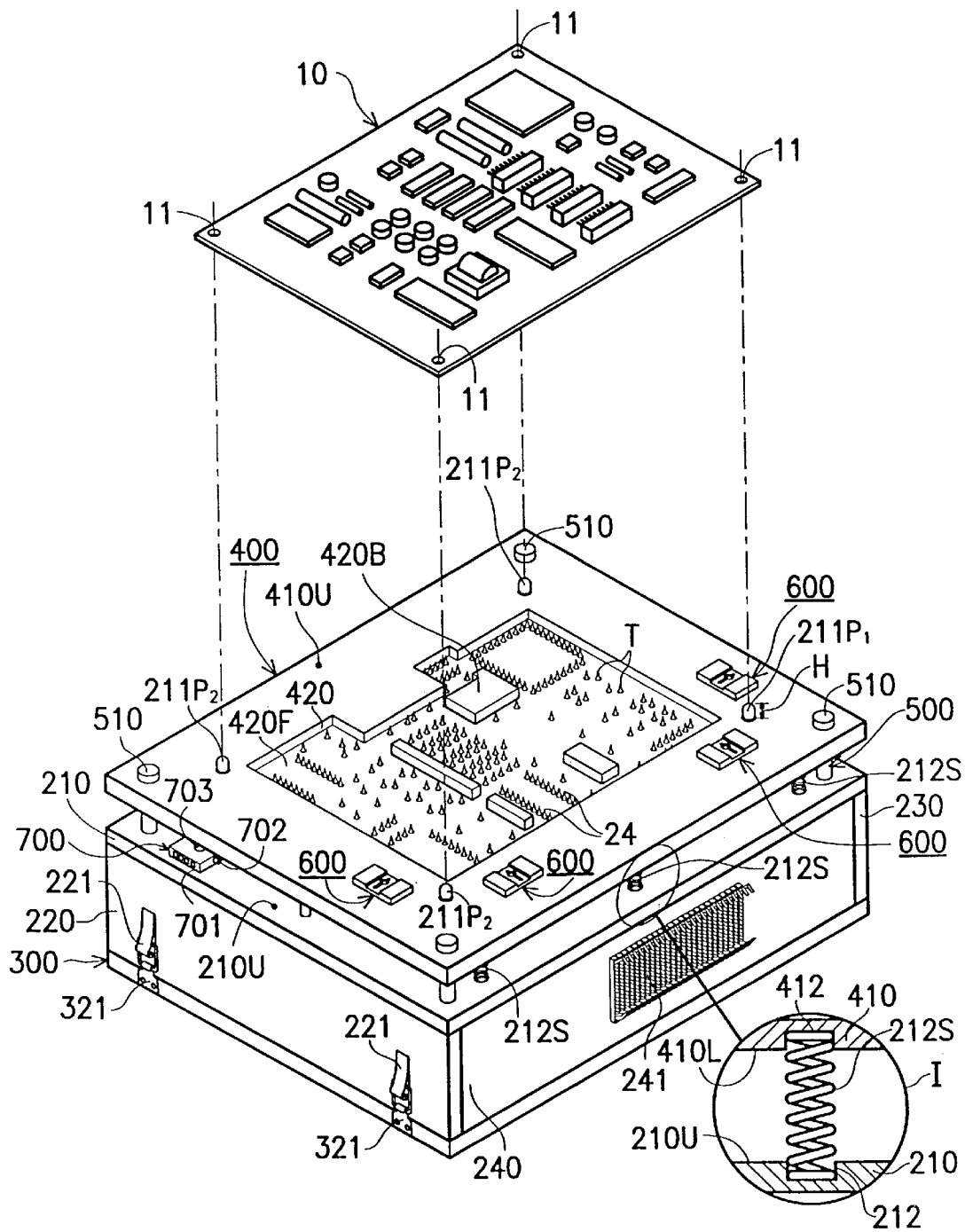
FIG. 3A is a perspective view showing the printed circuit board and the jig according to the present invention.
FIG. 3B is a partly cross-sectional view showing the location of one elastic member according to the region I of FIG. 3A.

A spring may be used for the elastic member 212S. A plurality of elastic members 212S are installed between the top plate 210 and the working plate 400. The ends of the working plate 400 are separately positioned in the first spring seat 212 located on the first surface 210U of the top plate 210 and positioned in the second spring seat 412 located on the third surface 410L of the working plate 400, as shown in FIG. 3B. Therefore, the working plate 400 can elastically and smoothly slide along the guide pins $211P_1$, $211P_2$ and the guide columns 500 whereby using the elastic members 212S serves as cushions therebetween.

A plurality of probes 213P are retractably installed in the first through holes 213 of the top plate 210 individually, wherein the probes 213 can simultaneously pass through the second through holes 413 of the working plate 400 when force is applied to the working plate 400.

On the second surface 410U of the working plate 400, a concavity 420 is formed which contains all the second through holes 413 thereon, and the bulged sections 420B are formed within the concavity 420. The space of the concavity 420 is suitable for placing the circuit board 10 with its soldering side attached to the second surface 410U of the working plate 400, and the bulged sections 420B are used to support and prevent the circuit board 10 from deformation. Further, the adjustable guiding members 600 are installed on the places in the vicinity of the first guiding holes 411. Each guiding member 600 is formed with a groove 610G thereon, wherein a screw 620 and a washer 630 are integrally used to position the guiding member 600 by fastening the screw 620 through the groove 610G on the working plate 400 for the different sizes of the circuit board 10.

Referring to FIG. 3A, all the tips T of the probes 213P simultaneously protrude from the bottom surface 420F of the concavity 420, and the top portion of the guide pins $211P_1$, $211P_2$ protrude from the second surface 410U of the working plate 400 at a same predetermined height H when the working plate 400 is positioned by the guide columns 500 and the guide pins $211P_1$, $211P_2$ as well as supported by the elastic members 212S. The circuit board 10 which formed with a plurality of holes 11 can be easily positioned between the guide pins $211P_1$, $211P_2$ by the guiding members 600.

In FIG. 3B, both ends of each elastic member 212S are separately positioned in the first spring seats 212 which are formed on the first surface 210U of the top plate 210 and positioned in the second spring seats 412 which are formed on the third surface 410L of the working plate 400. Therefore, the working plate 400 can be smoothly moved by the elastic members 212S without interference between the guide pins $211P_1$, $211P_2$ and the guide columns 500. The sites of bulged sections 420B are installed on the bottom surface 420F and placed by the allocation of the soldering points of the electric elements 12 on the circuit board 10.

Therefore, since there is no deformation, the circuit board 10 can be positioned on the second surface 410U of the working plate 400 and uniformly touched on the tips T of the probes 213P when the working plate 400 is being pressed. Further, all the probes 213P are electrically coupled to a connector 241 which is installed on the sidewall of the side plate 230, and then the connector 241 also can be electrically coupled to a tester such as IC-Circuit Machine(not shown in Figs). Thus, the testing signals from the probes 213P can be transmitted to the tester by the connector 241.

For estimating the life of the probes 213P during the testing process, a counter can be added. As shown in FIG. 3A, a counter 700, placed on the first surface 210U of the top plate 210, mainly consists of an indicator 701, a reset 702 and a button 703. The button 703 serves as a detecting portion to count the times force is applied to the working plate 400 during the testing process, and the outcome is displayed on the indicator 701.

Figure 4:
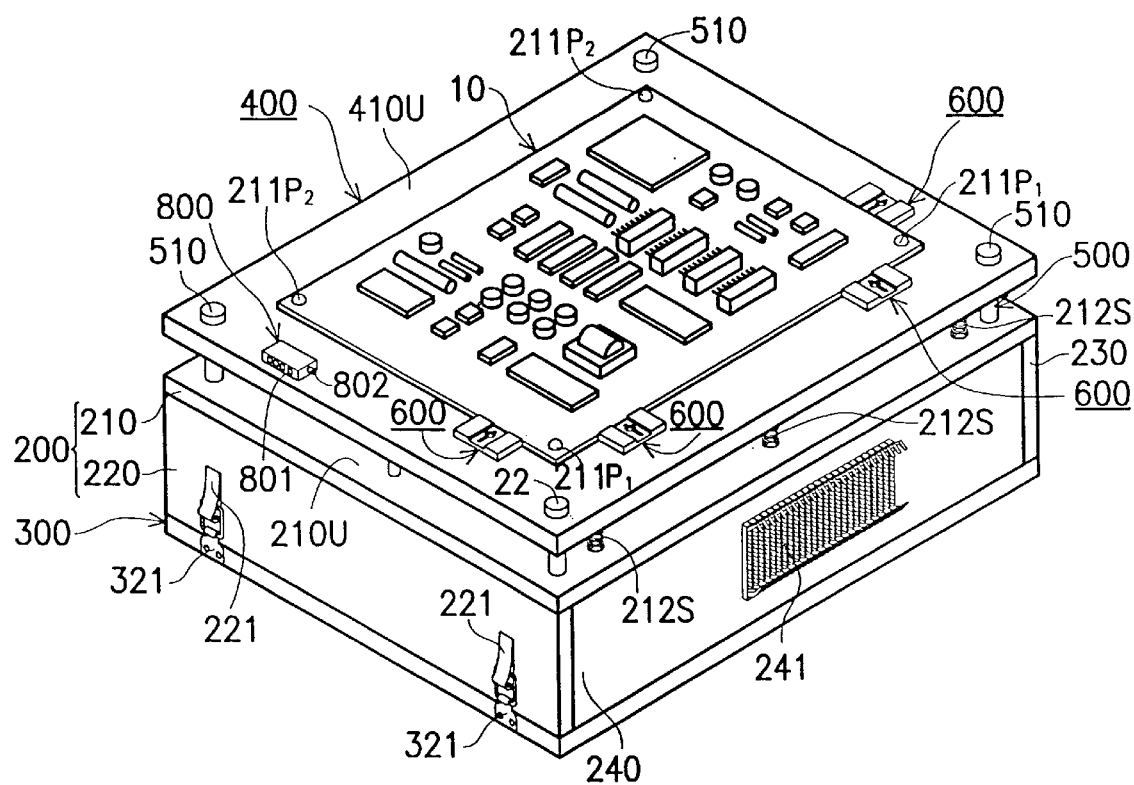
FIG. 4 is a perspective view showing the allocation of the counter and the position of the printed circuit board.

FIG. 4 is a perspective view showing the printed circuit board 10 positioning on the second surface 410U of the working plate 400 and another counter 800 mounting on the working plate 400. The circuit board 10 can be easily positioned between the guide pins 211P₁, 211P₂ by the guiding members 600. When the prescribed force is applying on the working plate 400, the tips T of the probes 213P are uniformly touched on the soldering points of the circuit board 10 by the elastic members 212S. An oscillating counter 800, placed on the second surface 410U of the working plate 400, also comprises an indicator 801 and a reset 802. The number of times force is applied to the working plate 400 can be detected by this counter 800, and therefore the life of the probes 213P can be estimated easily.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. A jig for electrically bridging between a circuit board and a tester under test, said circuit board having a plurality of soldering points and at least one hole, comprising:
   a base, substantially being a frame structure with a chamber therein, having a first surface, said first surface having a plurality of first through holes corresponding to said soldering points and at least one guide pin applying to guiding said hole of said circuit board;
   at least two guide columns for installing on said first surface, each said guide column having a stopper at one end;
   a working plate having a second surface and a third surface opposite to said second surface, said working plate being installed on said first surface and having a plurality of second through holes corresponding to said first through holes in said first surface, said working plate having at least one first guide hole and at least two second guide holes for containing said guide pin and said guide columns, respectively, whereas said working plate slides along said guide pin and said guide columns smoothly and the stroke of said working plate limited by said stopper of said guide columns;
   a plurality of elastic members, installed between said working plate and said base, for uniformly moving said working plate; and
   a plurality of probes, retractably installed in said first through holes respectively and outwardly protruded from said first surface, for penetrating said second through holes when said working plate being forced to get close to said first surface and electrically coupling to said soldering points of said circuit board under test, said probes being electrically coupled to said tester.

2. A jig for testing a circuit board according to claim 1, wherein said second surface of said working plate is formed with at least one concavity containing all said second through holes, and at least one bulged section formed in said concavity for supporting said circuit board if deformed.

3. A jig for electrically bridging between a circuit board and a tester under test, said circuit board having a plurality of soldering points and at least one hole, comprising:
   a base, substantially being a frame structure with a chamber therein, having a first surface, said first surface having a plurality of first through holes corresponding to said soldering points and at least one guide pin applying to guiding said hole of said circuit board;
   a working plate having a second surface and a third surface opposite to said second surface, said working plate being installed on said first surface and having a plurality of second through holes corresponding to said first through holes in said first surface, said working plate having at least one first guide hole for containing said guide pin whereas said working plate slides along said guide pin smoothly;
   at least two positioning dowels installed on said third surface of said working plate, and at least two dowel holes formed on said first surface of said base;
   a plurality of elastic members, installed between said working plate and said base, for uniformly moving said working plate; and
   a plurality of probes, retractable installed in said first through holes respectively and outwardly protruded from said first surface, for penetrating said second through holes when said working plate is forced close to said first surface and electrically coupled to said soldering points of said circuit board under test, said probes being electrically coupled to said tester.

4. A jig for testing a circuit board according to claim 3, wherein said base comprises a top plate, a bottom plate and side plates which are installed between said top plate and said bottom plate, and said first surface is formed on said top plate.

5. A jig for testing a circuit board according to claim 4, wherein said sidewall plates are formed with first joint members as well as said bottom plate is formed with second joint members, and said bottom plate is detachably mounted on said sidewall plates whereby the coupling of said first joint member and said second joint members.

6. A jig for testing a circuit board according to claim 5, wherein said bottom plate and said side plates are formed with a plurality of posts and holes, and said bottom plate is positioned on said side plate by matching said posts with said holes.

7. A jig for testing a circuit board according to claim 6, wherein said second surface of said working plate is formed with at least one concavity containing all said second through holes for supporting said circuit board smoothly and protecting said circuit board from being impaired.

8. A jig for testing a circuit board according to claim 7, wherein at least one connector is mounted on said base and electrically coupled to said probes.

9. A jig for electrically bridging between a circuit board and a tester under test, said circuit board having a plurality of soldering points and at least one hole, comprising:
   a base, substantially being a frame stricture with a chamber therein, having a first surface, said first surface having a plurality of first through holes corresponding to said soldering points and at least one guide pin applying to guiding said hole of said circuit board;
   a working plate having a second surface and a third surface opposite to said second surface, said working plate being installed on said first surface and having a plurality of second through holes corresponding to said first through holes in said first surface, said working plate having at least one first guide hole for containing said guide pin, whereas said working plate slides along said guide pin smoothly;
   a plurality of elastic members, installed between said working plate and said base, for uniformly moving said working plate;
   a plurality of probes, retractably installed in said first through holes respectively and outwardly protruded from said first surface, for penetrating said second through holes when said working plate is forced close to said first surface and electrically coupled to said soldering points of said circuit board under test, said probes being electrically coupled to said tester; and a counter installed between said first surface of said base and said working plate for counting the moving times of said working plate and estimating the life of said probes.

10. A jig for testing a circuit board according to claim 9, wherein at least one guiding member adjustably mounted on said second surface of said working plate, and said guiding member is used to guide said circuit board so as to position in said guide pins as well as place properly said circuit board on said second surface of said working plate.

11. A jig for testing a circuit board according to claim 10, wherein at least two positioning dowels are installed on said third surface of said working plate, and at least two dowel holes are formed on said first surface of said base.

12. A jig for testing a circuit board according to claim 11, wherein said base comprises a top plate, a bottom plate and side plates which are installed between said top plate and said bottom plate, and said first surface is formed on said top plate.

13. A jig for testing a circuit board according to claim 12, wherein said sidewall plates are formed with first joint members as well as said bottom plate is formed with second joint members, and said bottom plate is detachably mounted on said sidewall plates whereby the coupling of said first joint member and said second joint members.

14. A jig for testing a circuit board according to claim 13, wherein said bottom plate and said side plates are formed with a plurality of posts and holes, and said bottom plate is positioned on said side plate by matching said posts with said holes.

15. A jig for electrically bridging between circuit board and a tester under test, said circuit board having a plurality of soldering points, comprising:

a base, substantially being a frame structure with a chamber therein, having a first surface, said first surface having a plurality of first through holes corresponding to said soldering points, and at least one guide pin thereon;

a working plate having a second surface and a third surface opposite to said second surface, said working plate being installed on said first surface and having a plurality of second through holes corresponding to said first through holes in said first surface, said working plate having at least one first guide hole for containing said guide pin whereas said working plate slides along said guide pin smoothly;

a plurality of elastic members, installed between said working plate and said base, for elastically moving said working plate;

a plurality of probes, retractably installed in said first through holes respectively and outwardly protruded from said first surface, for penetrating said second through holes when said working plate is forced close to said first surface and electrically coupled to said soldering points of said circuit board under test, said probes being electrically coupled to said tester; and a counter installed on said working plate for counting the moving times of said working plate and estimating the life of said probes.

16. A jig for testing a circuit board according to claim 15, wherein at least one guiding member adjustably mounted on said second surface of said working plate, and said guiding member is used to guide said circuit board so as to position in said guide pins as well as place properly said circuit board on said second surface of said working plate.

17. A jig for testing a circuit board according to claim 16, wherein at least two positioning dowels are installed on said third surface of said working plate, and at least two dowel holes are formed on said first surface of said base.

18. A jig for testing a circuit board according to claim 17, wherein said base comprises a top plate, a bottom plate and side plates which are installed between said top plate and said bottom plate, and said first surface is formed on said top plate.

19. A jig for testing a circuit board according to claim 18, wherein said sidewall plates are formed with first joint members as well as said bottom plate is formed with second joint members, and said bottom plate is detachably mounted on said sidewall plates whereby the coupling of said first joint member and said second joint members.

20. A jig for testing a circuit board according to claim 19, wherein said bottom plate and said side plates are formed with a plurality of posts and holes, and said bottom plate is positioned on said side plate by matching said posts with said holes.

* * * * *